(12) United States Patent
Wu

(10) Patent No.: US 7,556,400 B2
(45) Date of Patent: Jul. 7, 2009

(54) BACKSIDE ACCESSIBLE DISPLAY

(76) Inventor: Jiahn-Chang Wu, No. 15, Lane 13, Alley 439, Her-Chiang Street, Chutung, Hsin-Chu (TW) 310

( * ) Notice: Subject to any disclaimer, the term of this patent is extended or adjusted under 35 U.S.C. 154(b) by 309 days.

(21) Appl. No.: 11/458,842

(22) Filed: Jul. 20, 2006

(65) Prior Publication Data

US 2007/0215884 A1 Sep. 20, 2007

(30) Foreign Application Priority Data

Mar. 20, 2006 (TW) .............................. 95109372 A

(51) Int. Cl.
*F21V 21/00* (2006.01)
(52) U.S. Cl. ...................... 362/249; 362/800; 257/81; 257/99

(58) Field of Classification Search ................. 362/249, 362/800; 257/79, 81, 84, 99, 433–434
See application file for complete search history.

(56) References Cited

U.S. PATENT DOCUMENTS

| | | | | |
|---|---|---|---|---|
| 4,241,281 A | * | 12/1980 | Morimoto et al. | ........... 315/161 |
| 2004/0227146 A1 | * | 11/2004 | Wu | .............................. 257/99 |

\* cited by examiner

*Primary Examiner*—Sandra L O'Shea
*Assistant Examiner*—Jason Moon Han

(57) ABSTRACT

A light board is made with a receptacle substrate for holding cassette light units. The convenience of assembly and disassembly of the light units from the receptacle substrate makes the product easily to be maintained for changing different color light units, changing different displaying patterns, and removing or replacing a failure light unit.

5 Claims, 11 Drawing Sheets

BACKSIDE ACCESSIBLE DISPLAY

RELATED APPLICATIONS

The present application is based on, and claims priority from, Taiwan Application Serial Number 095109372, filed Mar. 20, 2006, the disclosure of which is hereby incorporated by reference herein in its entirety.

BACKGROUND OF THE INVENTION

1. Field of the Invention

This invention relates to a matrix display of light emitted diodes with a backside that is accessible for light unit insertion and maintenance.

2. Description of the Related Art

FIG. 1 is a traditional light board. The conventional light board is a printed circuit board (PCB) 10 with a plurality of light-emitting diode (LED) chips 11, only one LED 11 is shown in FIG. 1, each of the diodes has bottom metals 11a and 11b. Corresponding metal circuits 10a and 10b are provided on the board 10 to electrically couple with the electrodes 11a and 11b of the light-emitting diode chip 11 respectively to form a traditional light-emitting diode display board. The shortcomings of the prior art are as follows: (1) inflexibility in color changing, i.e., it is impossible or inconvenient to change different light color chips at any moment; (2) inconvenience of maintaining and replacing a failure diode chip.

SUMMARY OF THE INVENTION

The primary object of the present invention is to prepare a light board that is convenient for assembly and disassembly of the light units from a backside of the light board. A second object of the present invention is to provide a light board that is easily to be maintained for changing different color light units, or changing different displaying patterns. A third object of the present invention is to provide a light board that allows easy and rapid replacement of a failure light unit from the backside of the light board.

In a light board using a cassette light unit, the cassette light unit has a top layer electrode plate; a bottom layer electrode plate, and a transparent unit that is made at the top of the light chip for modifying the light beam emitted from the light chip. A light board has a first metal coupling with the top layer electrode plate of the cassette unit when the cassette light unit is inserted in position. A second metal is electrically coupling with the bottom layer electrode plate of the cassette light unit when the cassette light unit is inserted in position. A slit or space between the first metal plate and the second metal plate is for the anchor of the light unit. An insulation material is positioned between the first metal plate and the second metal plate for electrical isolation therebetween.

The cassette light unit in the present invention comprises: a light-emitting diode chip, which has a first electrode and a second electrode; a top layer electrode plate which electrically couples with the first electrode of the light-emitting diode chip; a bottom layer electrode plate which electrically couples with the second electrode of the light-emitting diode chip. The top layer electrode plate has an open area to accommodate the light-emitting diode chip onto the bottom layer electrode plate. An insulation material is positioned between the top layer electrode plate and the bottom layer electrode plate for electrical insulation therebetween. A transparent head is positioned above the light-emitting diode chip for modifying the light beam emitted from the light chip.

The present invention uses a light board that has a first opening on a first metal for light emitting and a second opening on a second metal for insertion of the light unit, and it is convenient to change different color light units, and it is easy and rapid in and out of the light board to remove or replace a failure light unit from backside of the light board.

DETAILED DESCRIPTION OF THE EMBODIMENTS OF THE INVENTION

Figure 1:
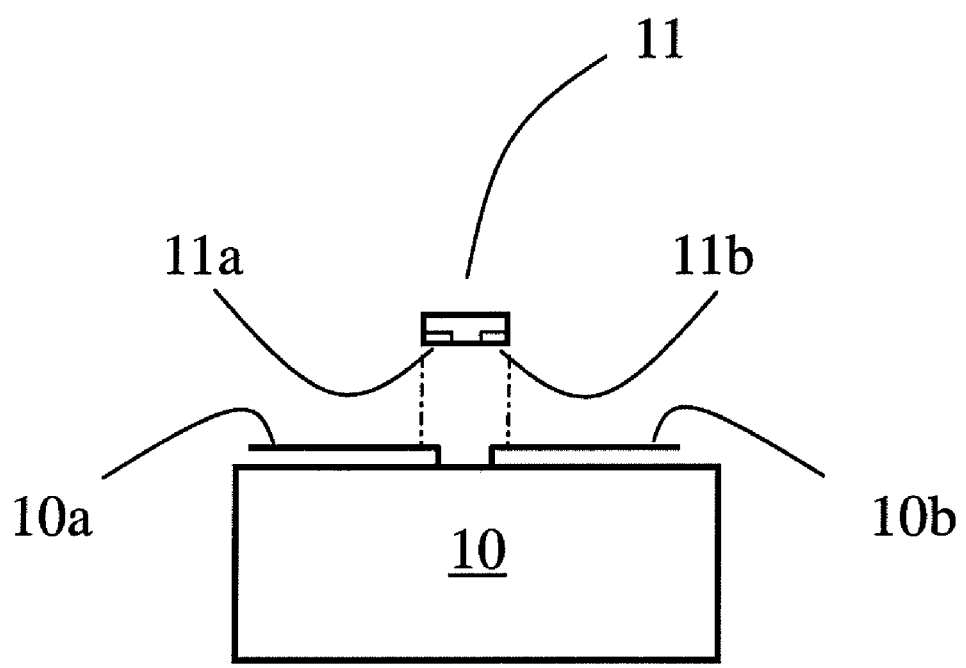
FIG. 1 is a traditional light board.
Figure 2:
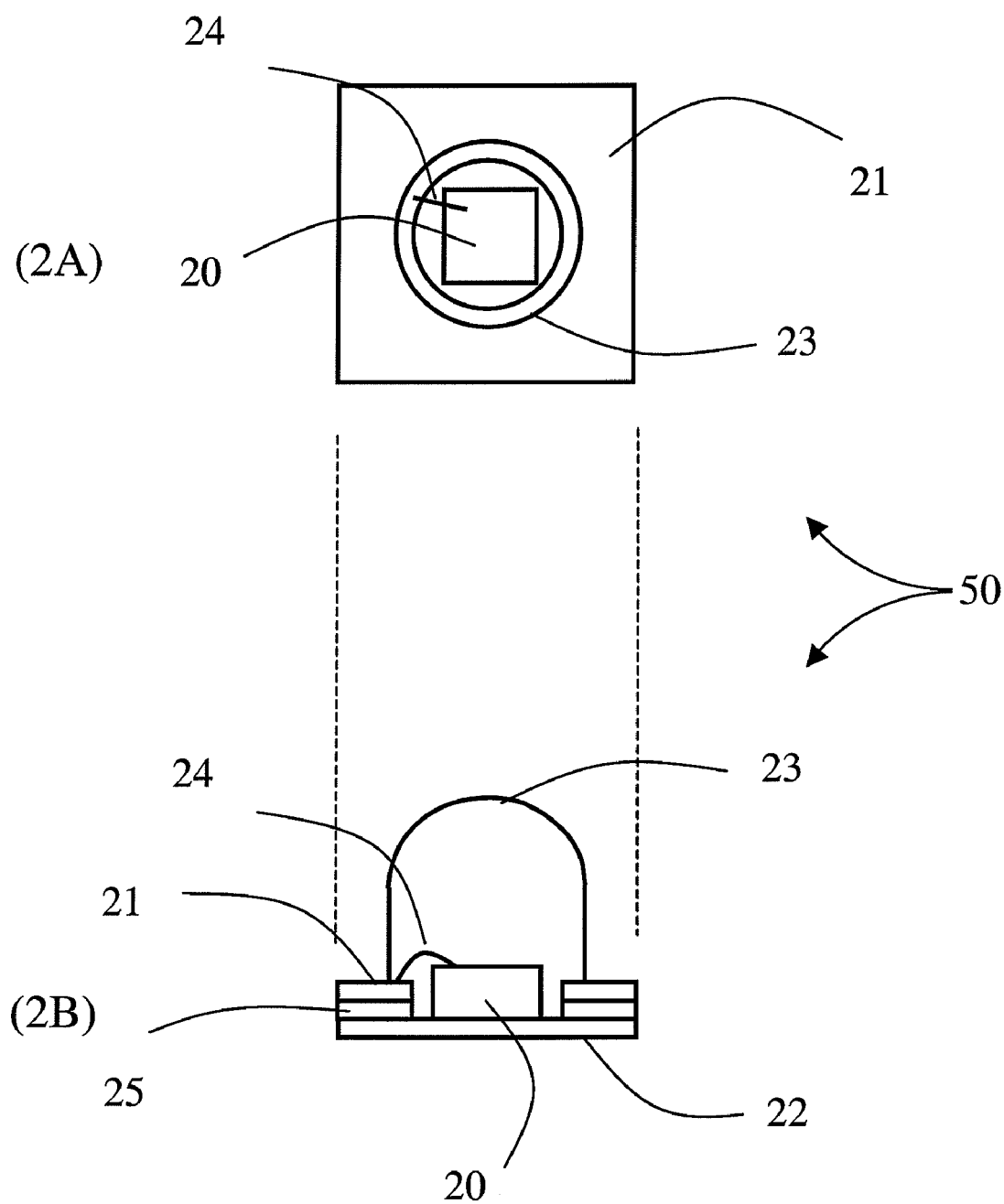
FIG. 2A is a top view of a cassette light unit used in the present invention.
FIG. 2B is a side view of FIG. 2.

FIG. 2A is a top view of a light unit 50 used in the present invention. It shows a cassette light unit 50 that encapsulates a light-emitting diode chip 20. The light unit 50 has a pedestal with a top metal 21 and a bottom metal 22. The first electrode or surface electrode of the light-emitting diode chip 20 is electrically coupled with the top metal 21 through a bonding wire 24. The top metal 21 has an open area at its center for mounting a light-emitting diode chip 20 onto the top surface of bottom metal 22. The second electrode or bottom electrode of the light-emitting diode chip 20 is electrically coupled with the bottom metal 22. A transparent glue 23 is coated above the light-emitting diode chip 20 for modifying the emitted light and to ensure the reliability of the product. Double wire bonding can be used to couple the two electrodes respectively to the top metal 21 and the bottom metal 22 if the LED 20 has two surface electrodes.

FIG. 2B is a side view of the light unit 50 of FIG. 2A. It shows a cassette light unit that comprises: a light-emitting diode chip 20 mounted on the top surface of the bottom metal 22 through an open area of the top metal 21. The top metal 21 is electrically coupled with the first electrode or surface electrode of the light-emitting diode chip 20 through a metal wire 24. The bottom metal 22 is electrically coupled with the second electrode or bottom electrode of the light-emitting diode chip 20. A transparent glue 23 is made above the light-emitting chip 20 to modify the emitted light. An insulation material 25 is positioned between the top metal 21 and the bottom metal 22 for electrical insulation therebetween.

Figure 3:
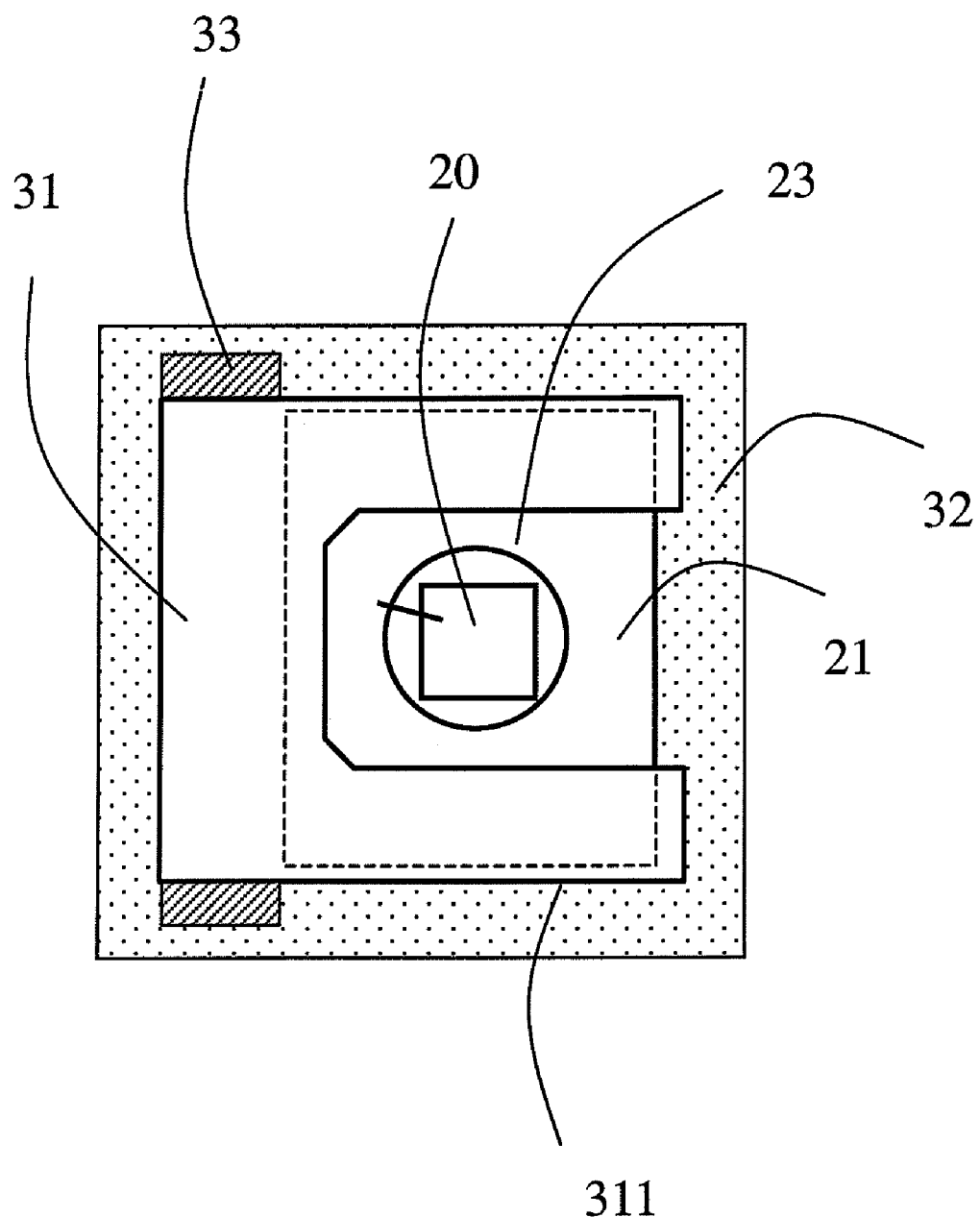
FIG. 3 is a top view of a first embodiment of the present invention with single light unit.

FIG. 3 is a top view of a first embodiment of the present invention with a single light unit 50. A light board with a single cassette light unit 50 is shown. A receptacle substrate of the light board has a first metal 31 and a second metal 32. The first metal 31 has a pair of elastic cantilevers 311 which hold the periphery of the top metal 21 of the pedestal of the cassette light unit 50 steadily, so as to anchor the cassette light unit 50 in position. The elastic cantilevers 311 are electrically coupled with the top metal 21 of the cassette light unit 50. The open area between the parallel elastic cantilevers 311 allows for light emission of the cassette light unit 50. An insulation material 33 is disposed between the first metal 31 and the second metal 32.

Figure 4:
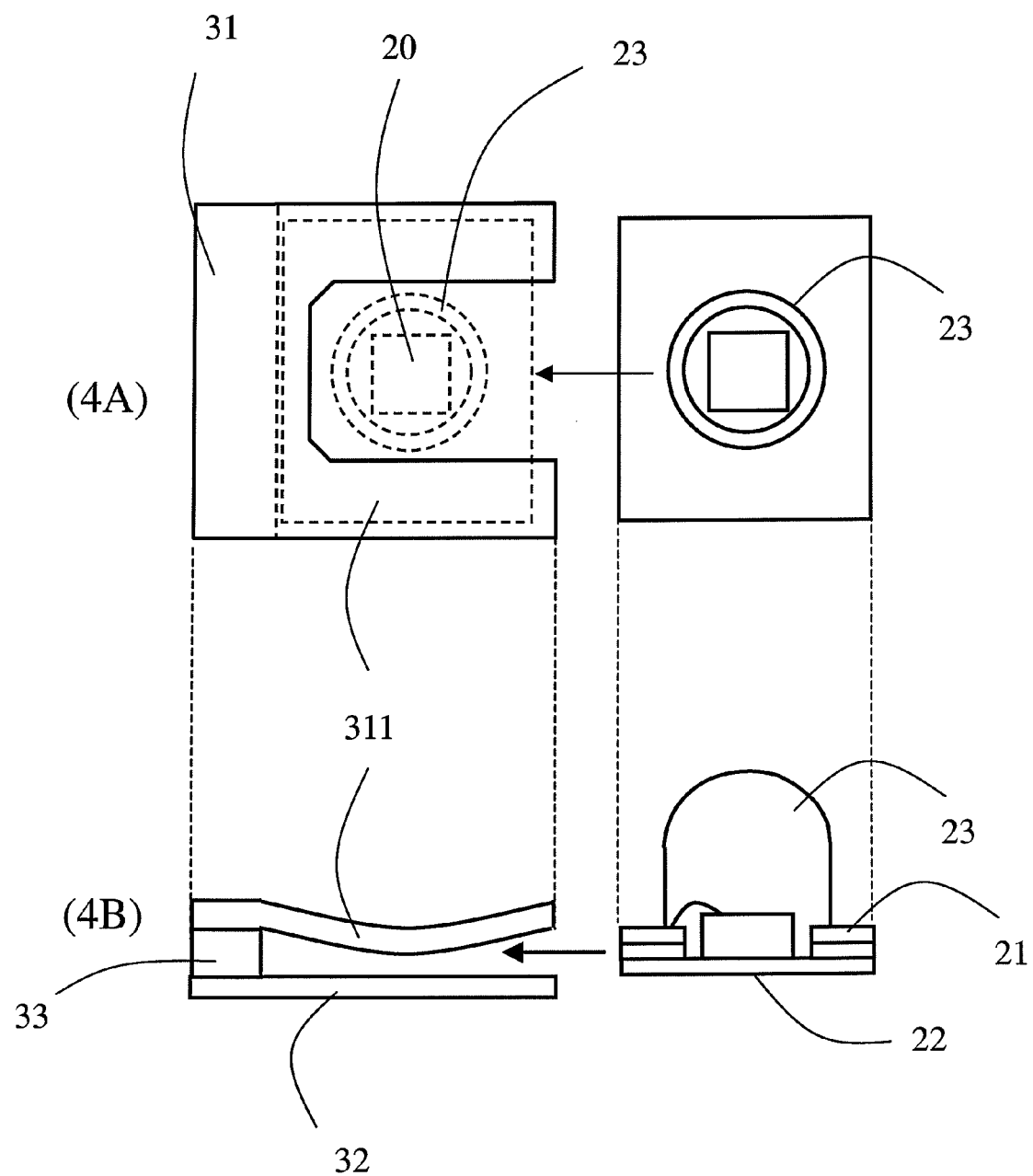
FIG. 4A is a top view of a light board of the present invention before insertion of a light unit.
FIG. 4B is a side view of FIG. 4A.

FIG. 4A is a top view of a light board of the present invention before insertion of a light unit 50. The first metal 31 has parallel elastic cantilevers 311. A light unit 50 is inserted between the first metal 31 and the second metal 32. The dotted lines denote an inserted light unit 50. The transparent glue 23 protrudes out above the first metal 31 for handling. The transparent glue 23 can be made thin for reliability only.

FIG. 4B is a side view of FIG. 4A. A cassette light unit 50 is ready to be inserted into a slot of the receptacle substrate. It shows that the receptacle substrate has a first metal 31 and a second metal 32, and an insulating material 33 disposed between the first metal 31 and the second metal 32. The first metal 31 has a pair of parallel elastic cantilevers 311 for touching and anchoring the inserted cassette light unit 50. The elastic cantilevers 311 are electrically coupled with the top metal 21 of the cassette light unit 50 and the second metal 32 is electrically coupled with the bottom metal 22 of the cassette light unit 50 when the cassette light unit 50 is inserted in position. Due to the small size of the cassette light unit 50, the protruded transparent head 23 can be made bigger as a grip for handling for assembly and disassembly of the light unit 50. The transparent glue 23 can be alternatively made very thin for light modification or for reliability only.

Figure 5:
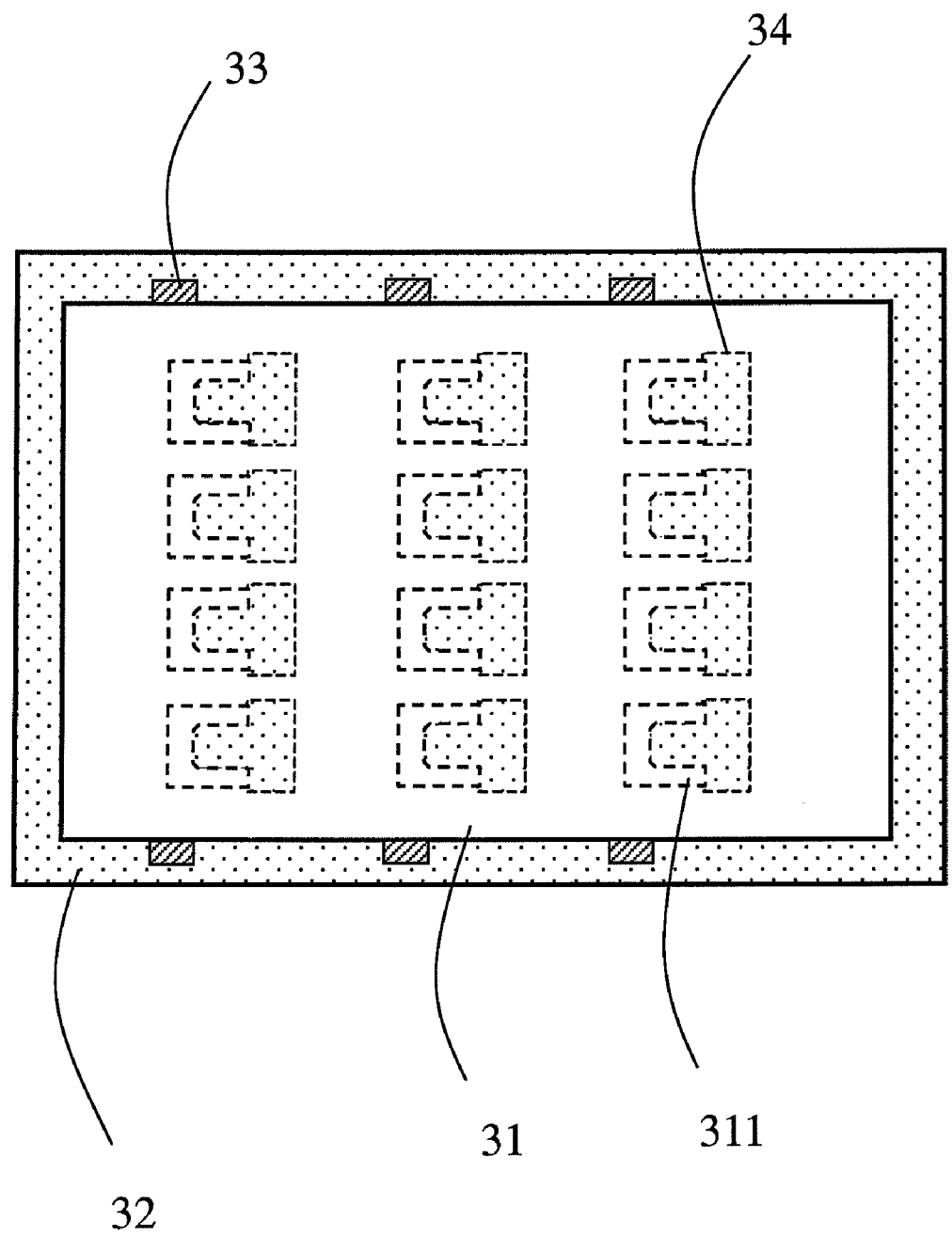
FIG. 5 is a top view of a light board of the present invention with multiple light units.

FIG. 5 is a top view of a light board of an embodiment of the present invention with multiple light unit slots arranged in a row or in a line-type. An elongated light board receptacle substrate 602 is shown, which includes a first metal 31, a second metal 32, and an insulation layer 33 inserted between the first metal 31 and the second metal 32. Parallel cantilevers 311 are elastically bent downward toward the second metal 32. The open area between the parallel cantilevers 311 is for accommodation of the light unit 50.

The transparent head 23 can be in the shape of a lamp bulb, so as to modify the emitted light. The transparent bead 23 can be made into different products, e.g., such as animals, plants, people, mountain or river sceneries, knifes or forks and buildings etc. The product shall emit light from the embedded light chip when the light unit is inserted into the receptacle in position, and become a lighting sculpture product.

Figure 6:
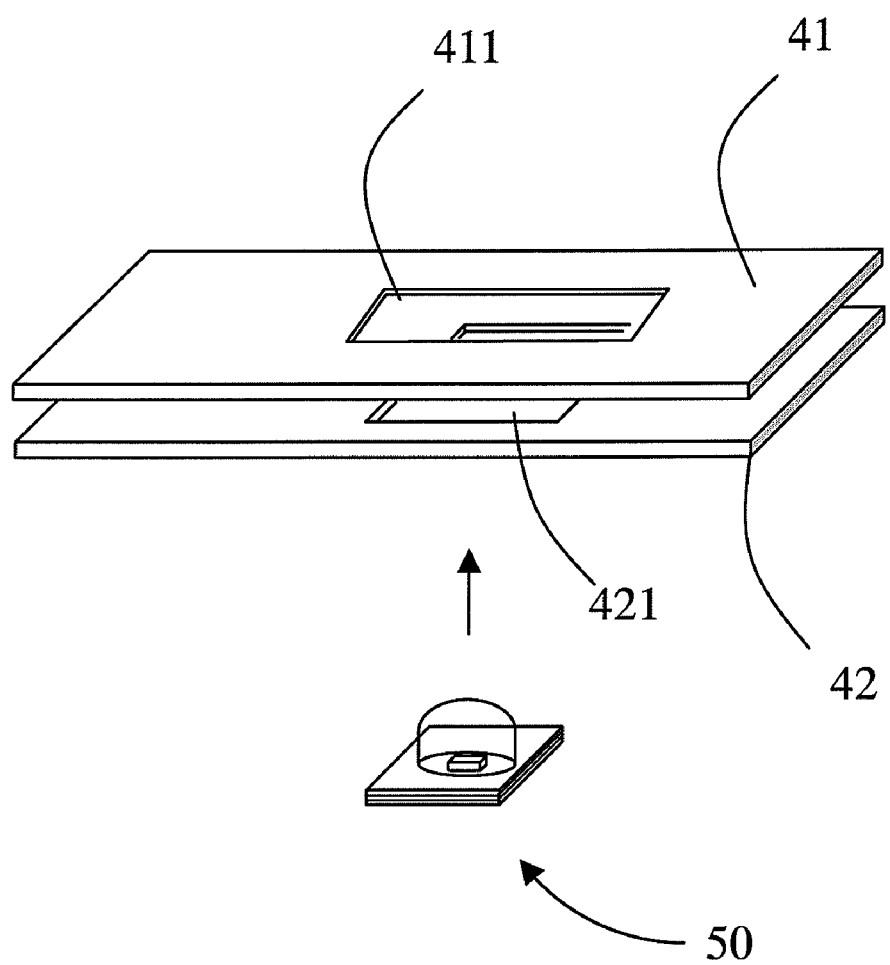
FIG. 6 is an elevation view of a backside accessible light board according to the present invention.

FIG. 6 is an elevation view of a backside accessible light board according to an embodiment of the present invention.

A first metal 41 has an opening 411 for light emitting; a second metal 42 has an opening 421 for insertion of the light unit 50. The light unit 50 is inserted from the opening 421 into the space between the first metal 41 and the second metal 42. In other words, the light unit 50 is inserted from the backside of the light board. The space between the first metal 41 and the second metal 42 is substantial equal to or a little larger than the base of the light unit 50 so as to hold the light unit 50 firmly in position after the light unit 50 is inserted.

Figure 7:
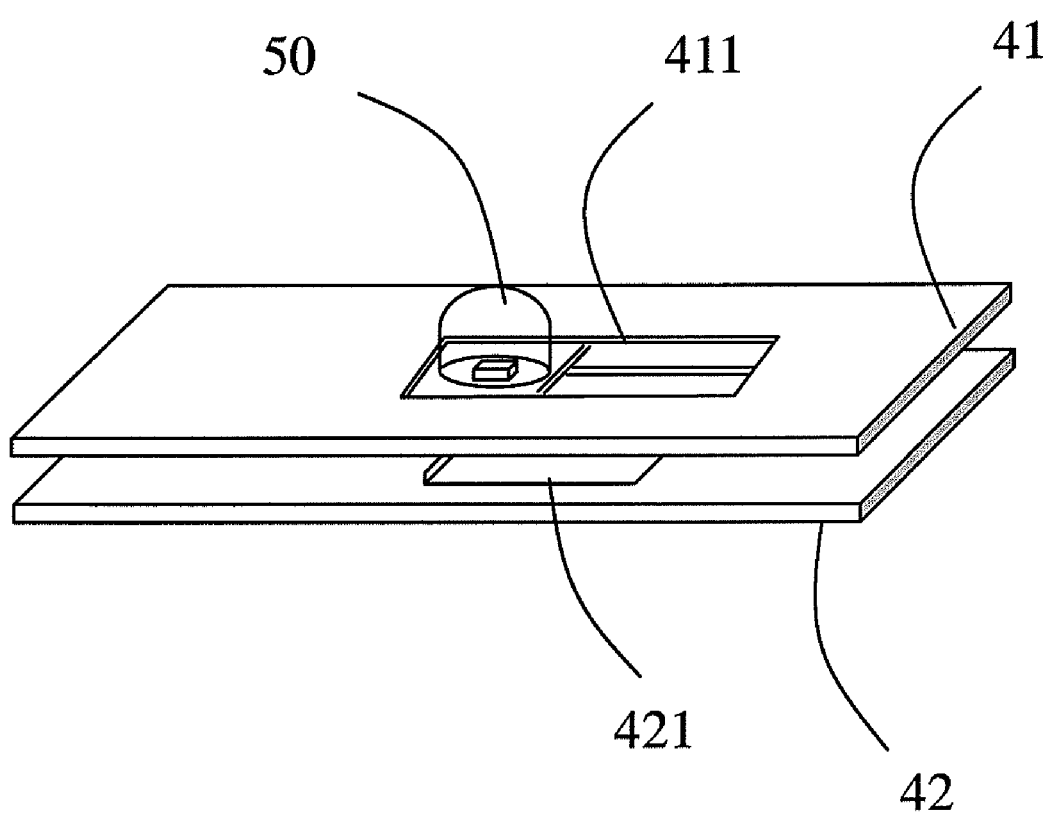
FIG. 7 is a light board after insertion of a light unit

FIG. 7 is a light board after the insertion of light unit 50.

Figure 8:
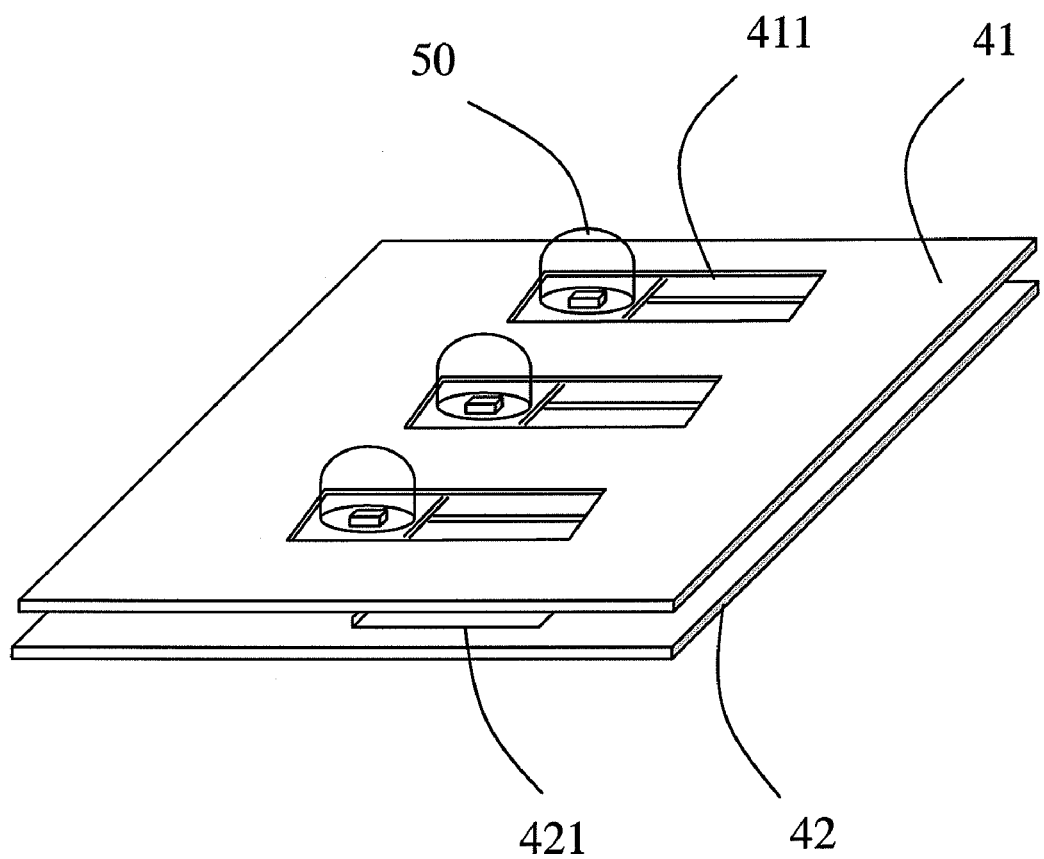
FIG. 8 is a light board with a line of light units.

FIG. 8 is a light board with a line of light units in accordance with another embodiment.

Three light units 50 are inserted in the space between the first metal 41 and the second metal sheet 42 for example. The opening 411 of the first metal 41 is for light emitting and the opening 412 of the second metal 42 is for insertion of the light unit 50 from the backside of the light board.

Figure 9:
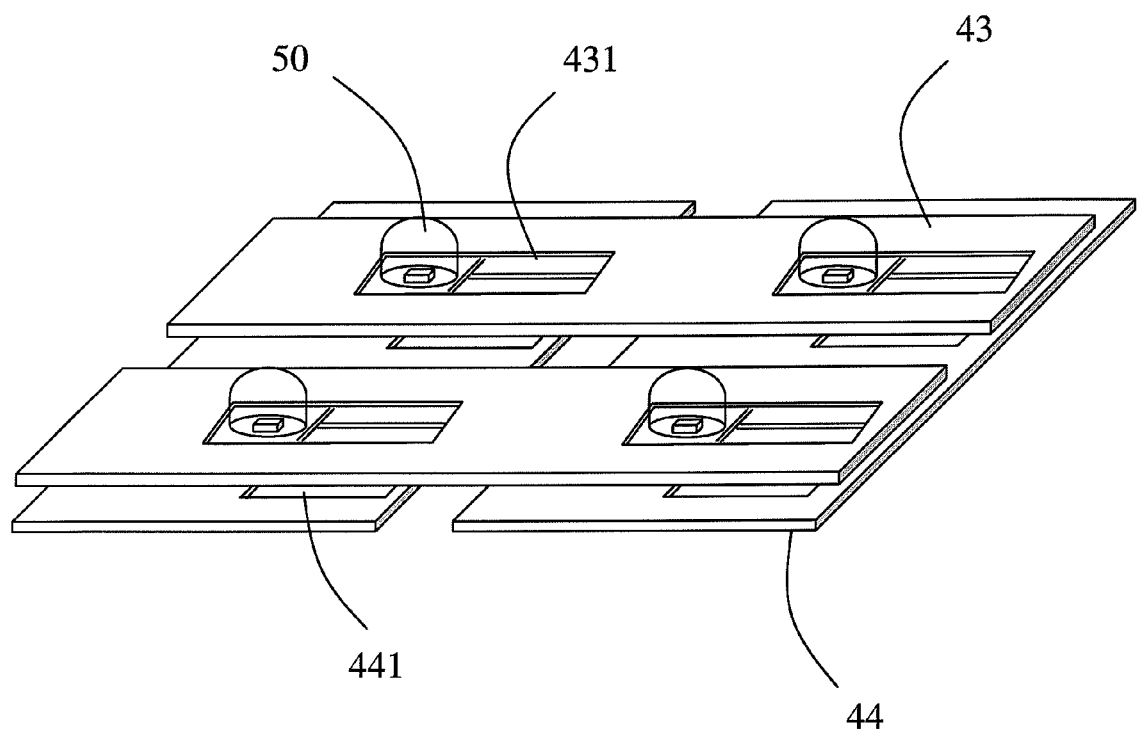
FIG. 9 is a display with matrix light units.

FIG. 9 is a display with matrix light units.

A display having a matrix of two by two light units is illustrated. A plurality of coplanar first parallel metals 43, each of which has two openings 431 for light emission. A plurality of coplanar second parallel metals 44 each of which has two openings 441 for insertion of light units 50. Each of the metals 43 and 44 are coupled to a power terminal (not shown in the figure) to control the on/off of each of the light units 50 to form a controllable display. The two openings 441 on a same metal 44 can be combined into a single long opening, i.e., the metal between the two openings 441 can be cut off, for the access of light units 50.

Figure 10:
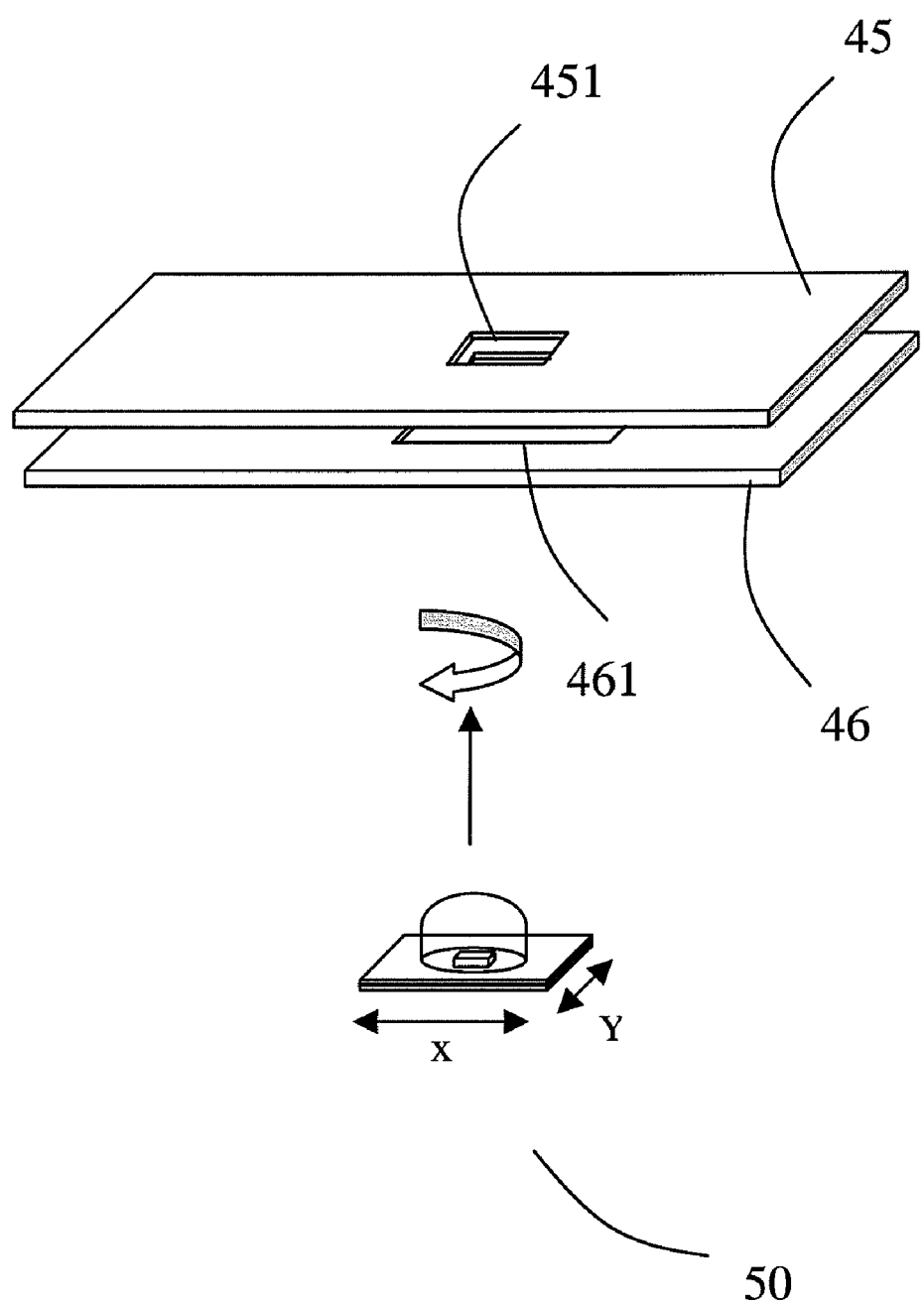
FIG. 10 is an alternative design for the present invention.

FIG. 10 is an alternative embodiment of the present invention.

Figure 11:
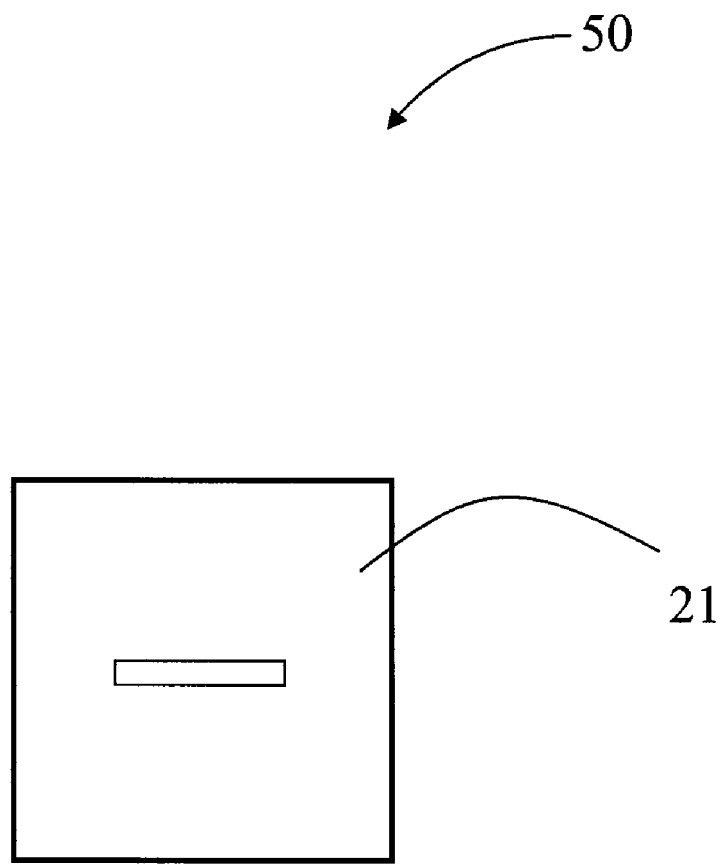
FIG. 11 shows the underside of the pedestal having a recess for engagement with a tool.

A first metal 45 has an opening 451 for light emission. A second metal 46 has an opening 461 for turning to anchor light unit 50. The light unit 50 has a rectangular base of X by Y, wherein X>Y, so that the light unit can be inserted and turned 90 degree to anchor its pedestal in position in the space between the first metal 45 and the second metal 46. The pedestal can be made elliptical, triangle, or of other unsymmetrical contours to serve a similar function. The space between the metal 45 and metal 46 is made equal to or a little greater than the thickness of the base of the light unit 50 for holding the light unit 50 in position firmly. For turning or rotating the light unit 50, a recess (FIG. 11) or a cut is made on the lower surface of the base and such that a tool such as a screw driver can rotate the light units 50 after it is inserted.

While the preferred embodiments have been described, it will be apparent to those skilled in the art that various modifications may be made in the embodiments without departing from the spirit of the present invention. Such modifications are all within the scope of the present invention as defined by the appended claims.

What is claimed is:

1. A backside accessible display, comprising:
at least one light unit having a pedestal with a top electrode and a bottom electrode, and a transparent encapsulant above the pedestal;
a first metal having a first opening for receiving the transparent encapsulant and allowing light emission of said light unit; and
a second metal parallel with and spaced downwardly from the first metal, said second metal having a second opening for backside insertion of said light unit;
wherein
said transparent encapsulant protrudes through the first opening to be located at least partially above the first metal,
the pedestal is anchored between said first and second metals with the top electrode being in electrical contact with the first metal and the bottom electrode being in electrical contact with the second metal, and
said pedestal is anchored in a position out of alignment with the second opening to prevent from falling off.

2. A backside accessible display, comprising:
at least one light unit having a pedestal with a top electrode and a bottom electrode, and a transparent encapsulant above the pedestal;
a first metal having a first opening for receiving the transparent encapsulant and allowing light emission of said light unit; and
a second metal parallel with and spaced downwardly from the first metal, said second metal having a second opening for backside insertion of said light unit;
wherein
said transparent encapsulant protrudes through the first opening to be located at least partially above the first metal,
the pedestal is anchored between said first and second metals with the top electrode being in electrical contact with the first metal and the bottom electrode being in electrical contact with the second metal,
the pedestal and second opening have oblong shapes, the pedestal is passable through the second opening when the oblong shapes are oriented in a same direction, and the pedestal is anchored in between the first metal and second metal when said pedestal is moved or rotated relative to the second opening.

3. A backside accessible display, comprising:

at least one light unit having a pedestal with a top electrode and a bottom electrode, and a transparent encapsulant above the pedestal;

a first metal having a first opening for receiving the transparent encapsulant and allowing light emission of said light unit; and a second metal parallel with and spaced downwardly from the first metal, said second metal having a second opening for backside insertion of said light unit;

wherein said transparent encapsulant protrudes through the first opening to be located at least partially above the first metal, the pedestal is anchored between said first and second metals with the top electrode being in electrical contact with the first metal and the bottom electrode being in electrical contact with the second metal, and the pedestal comprises at an underside thereof a recess for engagement with a tool adapted to move or rotate said light unit.

4. A backside accessible display, comprising:

a plurality of light units, each having a pedestal with a top electrode and a bottom electrode;

a plurality of first coplanar parallel metals, each having a first opening for light emission of said light units; and a plurality of second coplanar parallel metals, each having at least one accessible second opening for backside insertion of said light units;

wherein said pedestal is anchored in a space between one of the first coplanar parallel metals and one of the second coplanar parallel metals, and in a position out of alignment with said second opening to prevent from falling off; and wherein the pedestal has an oblong shape that is passable through the second opening in one relative position between the pedestal and the second opening.

5. A backside accessible display, comprising:

a plurality of light units, each having a pedestal with a top electrode, and a bottom electrode;

a plurality of first coplanar parallel metals, each having a first opening for light emission of said light units; and a plurality of second coplanar parallel metals, each having at least one accessible second opening for backside insertion of said light units;

wherein said pedestal is anchored in a space between one of the first coplanar parallel metals and one of the second coplanar parallel metals, and in a position out of alignment with said second opening to prevent from falling off; and wherein the pedestal comprises at an underside thereof a recess for engagement with a tool adapted to move or rotate said light unit.

\* \* \* \* \*